United States Patent
Lim

(10) Patent No.: US 12,333,153 B2
(45) Date of Patent: Jun. 17, 2025

(54) MEMORY DEVICE AND OPERATING METHOD OF THE MEMORY DEVICE

(71) Applicant: SK hynix Inc., Icheon-si (KR)

(72) Inventor: Sung Yong Lim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 316 days.

(21) Appl. No.: 17/991,082

(22) Filed: Nov. 21, 2022

(65) Prior Publication Data

US 2024/0012568 A1    Jan. 11, 2024

(30) Foreign Application Priority Data

Jul. 6, 2022    (KR) .......... 10-2022-0083284

(51) Int. Cl.
*G06F 3/06*    (2006.01)

(52) U.S. Cl.
CPC ............ *G06F 3/0619* (2013.01); *G06F 3/064* (2013.01); *G06F 3/0653* (2013.01); *G06F 3/0679* (2013.01)

(58) Field of Classification Search
CPC ........ G11C 11/56; G11C 11/5692; G11C 7/12
See application file for complete search history.

(56) References Cited

U.S. PATENT DOCUMENTS 11,348,641 B2 *   5/2022   Shin ................. G11C 16/0483

FOREIGN PATENT DOCUMENTS

| EP | 4181135 A1 * | 5/2023 | ......... G11C 11/4074 |
| KR | 101929614 B1 | 12/2018 | |
| KR | 1020190123981 A | 11/2019 | |

* cited by examiner

*Primary Examiner* — Douglas King
*Assistant Examiner* — Christopher Lane Reece
(74) *Attorney, Agent, or Firm* — WILLIAM PARK & ASSOCIATES LTD.

(57) ABSTRACT

There are provided a memory device and an operating method of the memory device. The memory device includes: a memory block including first select transistors, memory cells, and second select transistors, which are connected between bit lines and a source line; a precharge controller for monitoring a program operation of the memory cells, and changing a precharge mode of unselected strings among strings included in the memory block according to a monitoring result; and a select line voltage generator for generating a positive voltage or a negative voltage, which is applied to a second select line connected to the second select transistors, according to the precharge mode selected in the precharge controller.

19 Claims, 14 Drawing Sheets

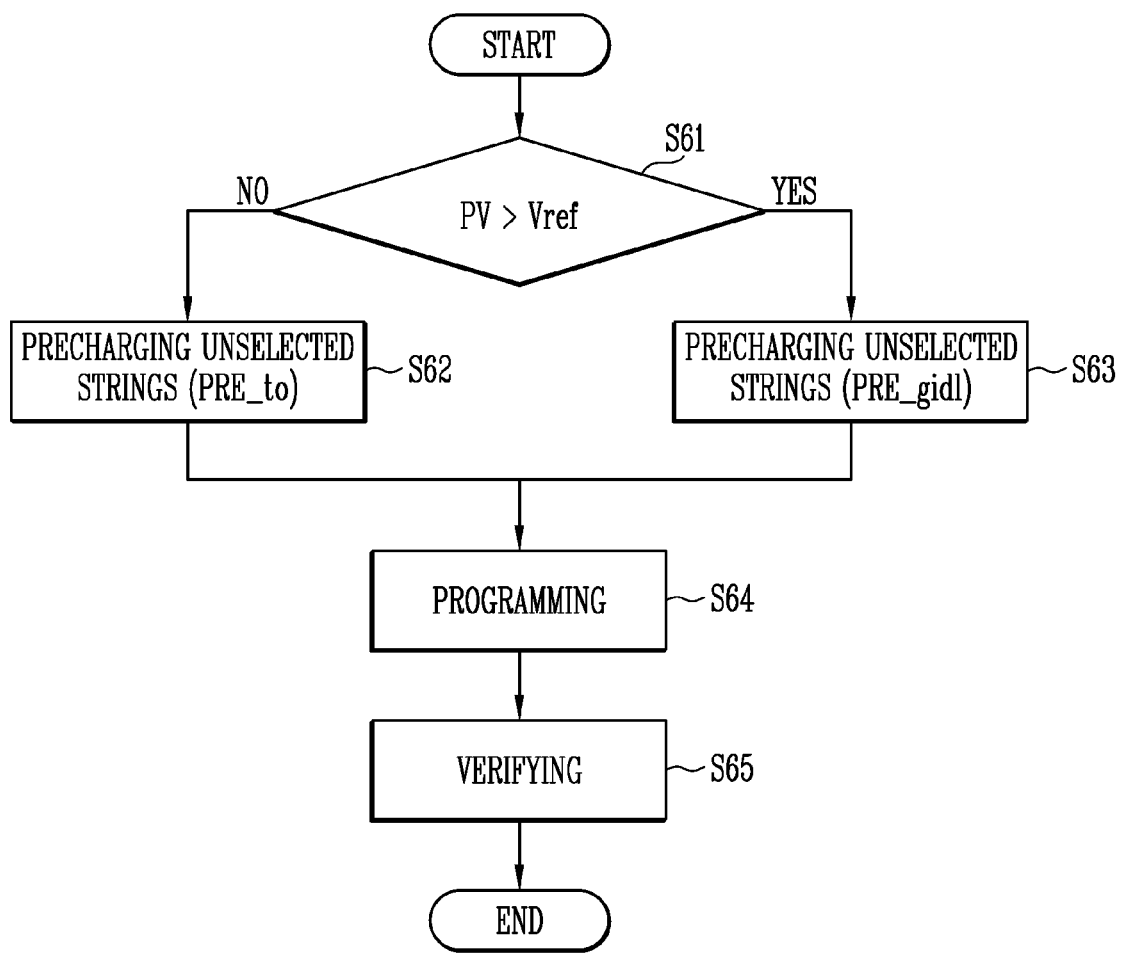

[PRE_to]

[PRE_gidl]

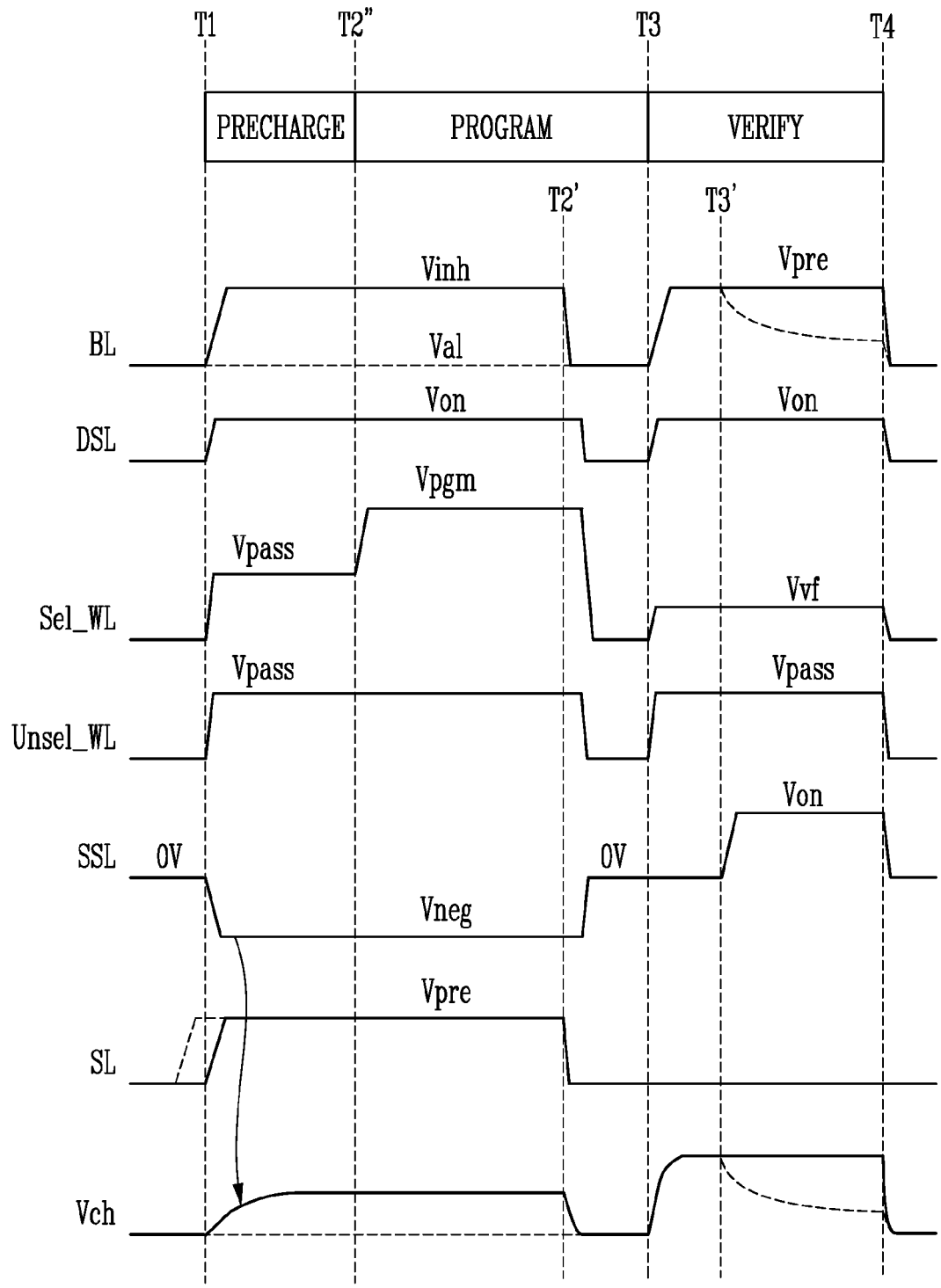

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2022-0083284, filed on Jul. 6, 2022, in the Korean Intellectual Property Office, the entire disclosure of which is incorporated herein by reference.

BACKGROUND

1. Technical Field

The present disclosure generally relates to a memory device and an operating method of the memory device, and more particularly, to a memory device configured to perform a program operation and an operating method of the memory device.

2. Related Art

A memory device may include a memory cell array in which data is stored, a peripheral circuit configured to perform a program, read or erase operation, and control logic configured to control the peripheral circuit.

The memory cell array may include a plurality of memory blocks, and each of the plurality of memory blocks may include a plurality of memory cells. A memory device having a three-dimensional structure may include memory cells stacked above a substrate. For example, in the memory device having the three-dimensional structure, memory blocks may include a plurality of strings extending in a vertical direction from the substrate, and each of the plurality of strings may include a plurality of memory cells.

In a program operation of a selected memory block among a plurality of memory blocks, memory cells included in selected strings among a plurality of strings included in the selected memory block may be programmed. While the selected memory cells are programed, programming of memory cells included in unselected strings should be inhibited. Therefore, a program allow voltage is applied to channels of the selected strings, and a program inhibit voltage is applied to channels of the unselected strings. Since the program allow voltage should have a voltage difference from a program voltage applied to a selected word line connected to the selected memory cells, the program allow voltage may be set as a ground voltage. Since the program inhibit voltage should have a low voltage difference from the program voltage applied to the selected word line, the program inhibit voltage may be set as a positive voltage. Therefore, a precharge phase of increasing a channel voltage of the unselected strings should be performed before a program phase of the selected memory cells is started. After the program phase, a verify phase of determining whether a threshold voltage of the selected memory cells has been increased to a target level may be performed.

Since the time required to perform the program operation is determined by the time for which the precharge phase, the program phase, and the verify phase are performed, the time for which the precharge phase, the program phase, and the verify phase are performed should be reduced to reduce the time required to perform the program operation.

SUMMARY

In accordance with an embodiment, there may be provided a memory device including: a memory block including first select transistors, memory cells, and second select transistors, which are connected between bit lines and a source line; a precharge controller configured to monitor a program operation of the memory cells, and change a precharge mode of unselected strings among strings included in the memory block according to a monitoring result; and a select line voltage generator configured to generate a positive voltage or a negative voltage, which is applied to a second select line connected to the second select transistors, according to the precharge mode selected in the precharge controller.

In accordance with an embodiment, there may be provided a memory device including: a memory block including selected strings and unselected strings, which are connected between bit lines and a source line; a source line voltage generator configured to apply a precharge voltage to the source line; and a select line voltage generator configured to apply a positive voltage or a negative voltage to a first select line adjacent to the bit lines and a second select line adjacent to the source line, wherein the first select line and the second select line are connected to the selected strings and the unselected strings, wherein the select line voltage generator is configured to: apply the positive voltage to the second select line to precharge the unselected strings when a target voltage of memory cells of selected memory cells included in the selected strings is equal to or lower than a reference voltage; and apply the negative voltage to the second select line to precharge the unselected strings when the target voltage is higher than the reference voltage.

In accordance with an embodiment, there may be provided a method of operating a memory device, the method including: comparing, with a reference voltage, a target voltage of selected memory cells among memory cells included in selected strings and unselected strings; transmitting a precharge voltage supplied to a source line to the unselected strings by turning on select transistors included in the unselected strings when the target voltage is equal to or lower than the reference voltage, and transmitting the precharge voltage supplied to the source line to the unselected strings by using a leakage current of the select transistors when the target voltage is higher than the reference voltage; and programming the selected memory cells.

In accordance with an embodiment, there may be provided a method of operating a memory device, the method including: programming first memory cells among memory cells included in a selected page to first to Nth program states; programming second memory cells among the memory cells to an (N+1)th program state; precharging the unselected strings by applying a positive voltage to select transistors connected between a source line to which a precharge voltage is supplied and the unselected strings in a program operation of the first memory cells; and precharging the unselected strings by applying a negative voltage to the select transistors in a program operation of the second memory cells. In some embodiments, N may be a positive integer greater than 1. In other embodiments, N may be a positive integer.

BRIEF DESCRIPTION OF THE DRAWINGS

Examples of embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an FIG. 1 is a diagram illustrating a memory device.

FIG. 6 is a diagram illustrating a program operation in accordance with an embodiment of the present disclosure.

FIG. 10 is a diagram illustrating a program operation to which the GIDL precharge mode is applied.

DETAILED DESCRIPTION

The specific structural and functional descriptions disclosed herein are merely illustrative for the purpose of describing embodiments according to the concept of the present disclosure. Additional embodiments according to the concept of the present disclosure can be implemented in various forms. Thus, the present disclosure should not be construed as limited to the embodiments set forth herein.

Hereinafter, it will be understood that, although the terms "first," "second," etc. may be used herein to describe various elements, these elements should not be limited by these terms. These terms are only used to distinguish one element from another element.

Various embodiments may provide a memory device capable of reducing a program operation time and an operating method of the memory device.

Figure 1:
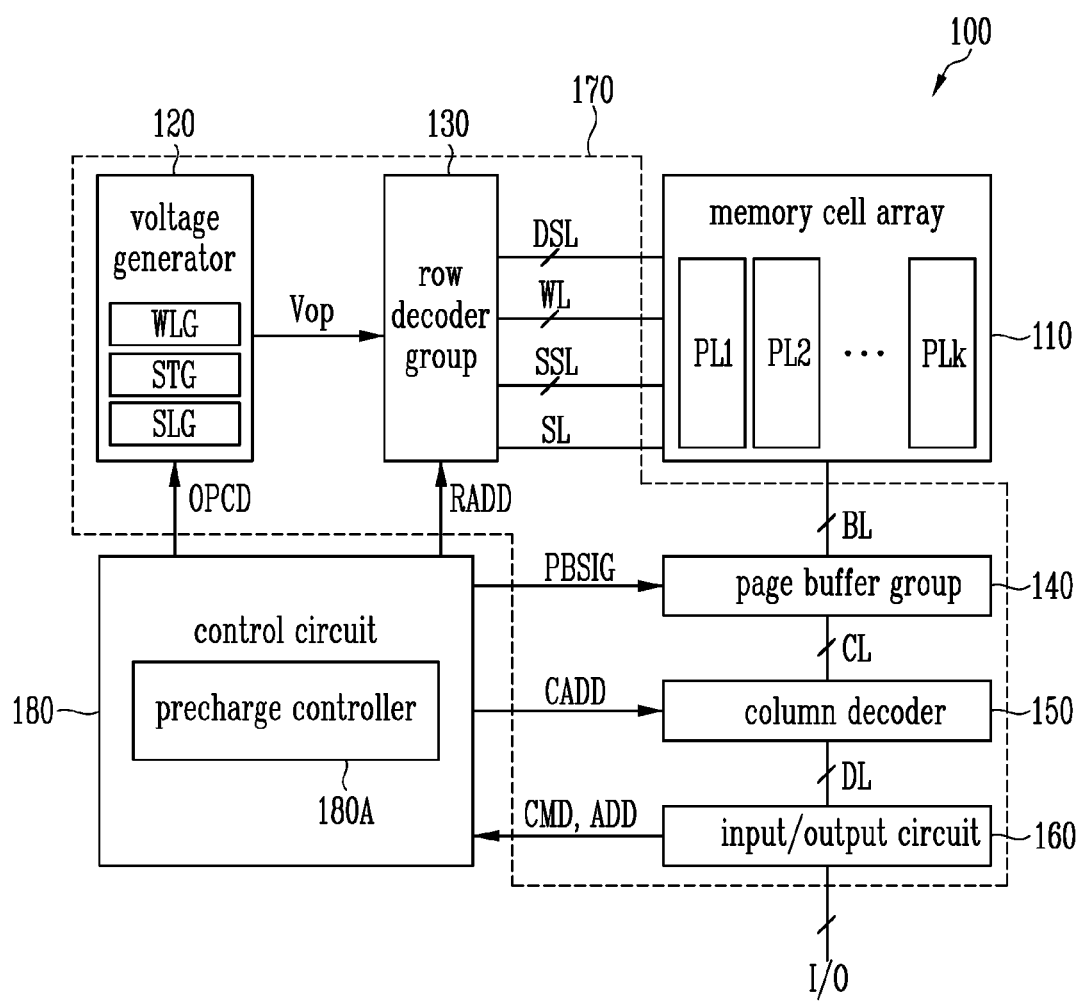

FIG. 1 is a diagram illustrating a memory device.

Referring to FIG. 1, the memory device 100 may include a memory cell array 110, a peripheral circuit 170, and a control circuit 180.

The memory cell array 110 may include at least one plane. For example, the memory cell array 110 may be configured in a multi-plane structure including first to kth planes PL1 to PLk. Each of the first to kth planes PL1 to PLk may include memory blocks, and each of the memory blocks may include memory cells. The memory blocks may be formed in a two-dimensional structure or a three-dimensional structure. The memory blocks having the two-dimensional structure may include memory cells arranged in parallel to a substrate. The memory blocks having the three-dimensional structure may include memory cells stacked in a vertical direction above a substrate. In this embodiment, for convenience of description, the memory blocks formed in the three-dimensional structure are described. However, this embodiment may be applied to the memory blocks having the two-dimensional structure.

The memory cells may store one-bit or two-or-more-bit data according to a program mode. For example, a mode in which one-bit data is stored in one memory cell is referred to as a single level cell mode, and a mode in which two-bit data is stored in one memory cell is referred to as a multi-level cell mode. A mode in which three-bit data is stored in one memory cell is referred to as a triple level cell mode, and a mode in which four-bit data is stored in one memory cell is referred to as a quad level cell mode. In addition, five-or-more-bit data may be stored in one memory cell.

The peripheral circuit 170 may be configured to perform a program operation for storing data, a read operation for outputting data stored in the memory cell array 110, and an erase operation for erasing data stored in the memory cell array 110. For example, the peripheral circuit 170 may include a voltage generator 120, a row decoder group 130, a page buffer group 140, a column decoder 150, and an input/output circuit 160.

The voltage generator 120 may generate various operating voltages Vop used for a program operation, a read operation, or an erase operation in response to an operation code OPCD. For example, the voltage generator 120 is configured to generate a program voltage, a pass voltage, a turn-on voltage, a turn-off voltage, a ground voltage, a negative voltage, a source voltage, a verify voltage, a read voltage, an erase voltage, a precharge voltage, and the like, in response to the operation code OPCD.

The voltage generator 120 may include a word line voltage generator WLG, a select line voltage generator STG, and a source line voltage generator SLG to generate various voltages. The word line voltage generator WLG may be configured to generate the program voltage, the pass voltage, the ground voltage, the verify voltage, or the read voltage. The select line voltage generator STG may be configured to generate the turn-on voltage, the turn-off voltage, the ground voltage, or the negative voltage. The source line voltage generator may be configured to generate the ground voltage, the erase voltage, or the precharge voltage.

The program voltage is a voltage applied to a selected word line among word lines WL in a program operation, and may be used to increase a threshold voltage of memory cells connected to the selected word line. The pass voltage is a voltage applied to unselected word lines among the word lines WL in a program or read operation, and may be used to turn on memory cells connected to the unselected word lines. The turn-on voltage is a voltage applied to a drain select line DSL or a source select line SSL, and may be used to turn on a drain select transistor or a source select transistor. The turn-off voltage is a voltage applied to the drain select line DSL or the source select line SSL, and may be used to turn off the drain select transistor or the source select transistor. The ground voltage may be a voltage of 0V. The negative voltage is a voltage lower than 0V, and may be applied to the source select line SSL in this embodiment. The source voltage is a voltage applied to a source line SL, and may be the negative voltage, the ground voltage, or a positive voltage. The verify voltage is a voltage for determining a threshold voltage of selected memory cells in a program or erase operation, and may be applied to a selected word line or all word lines connected to a selected memory block. The read voltage is a voltage applied to a selected word line in a read operation, and may be used to determine data stored in memory cells. The erase voltage is a voltage applied to the source line SL in an erase operation, and may be used to decrease a threshold voltage of memory cells. The precharge voltage is a positive voltage for precharging channels of unselected strings in a program operation, and may be supplied to the source line SL.

The row decoder group 130 may be configured to transmit the operating voltages Vop to the drains select lines DSL, the word lines WL, the source select lines SSL, and the source line SL, which are connected to a selected memory block, according to a row address RADD. For example, the row decoder group 130 may be connected to the voltage generator 120 through global lines, and be connected to the first to kth planes PL1 to PLk through the drain select lines DSL, the word lines WL, the source select lines SSL, and the source line SL. The row decoder group 130 may include row decoders (not shown) respectively connected to the first to kth planes PL1 to PLk. Each of the row decoders (not shown) may be connected to the memory blocks included in the first to kth planes PL1 to PLk through the drain select lines DSL, the word lines WL, the source select lines SSL, and the source line SL.

The page buffer group 140 may include page buffers (not shown) respectively connected to the first to kth planes PL1 to PLk. Each of the page buffers (not shown) may be connected to the memory blocks included in the first to kth planes PL1 to PLk through bit lines BL. The page buffers (not shown) may adjust a level of a voltage applied to the bit lines BL and a time at which the voltage is applied to the bit lines BL in response to page buffer control signals PBSIG, and store data read from the memory cells by sensing a current or voltage of the bit lines BL. In a program operation, the page buffers (not shown) may apply a program allow voltage, a program inhibit voltage, or a precharge voltage to the bit lines BL. The program allow voltage may be set as 0V or a negative voltage. The program inhibit voltage may be set as a positive voltage.

The column decoder 150 may be configured to transmit data between the page buffer group 140 and the input/output circuit 160 in response to a column address CADD. For example, the column decoder 150 may be connected to the page buffer group 140 through column lines CL, and be connected to the input/output circuit 160 through data lines DL.

The input/output circuit 160 may be configured to receive or output a command CMD, an address ADD, or data through input/output lines I/O. For example, the input/output circuit 160 may transmit, to the control circuit 180, a command CMD and an address ADD, which are received from an external controller through the input/output lines I/O, and transmit data received from the external controller through the input/output lines I/O to the column decoder 150. Alternatively, the input/output circuit 160 may output data transferred from the column decoder 150 to the external controller through the input/output lines I/O.

The control circuit 180 may output the operation code OPCD, the row address RADD, the page buffer control signals PBSIG, and the column address CADD in response to the command CMD and the address ADD. For example, when the command CMD input to the control circuit 180 is a command corresponding to a program operation, the control circuit 180 may control the peripheral circuit 170 to perform the program operation of a memory block selected by the address ADD. When the command CMD input to the control circuit 180 is a command corresponding to a read operation, the control circuit 180 may control the peripheral circuit 170 to perform the read operation of a memory block selected by the address ADD and to output read data. When the command CMD input to the control circuit 180 is a command corresponding to an erase operation, the control circuit 180 may control the peripheral circuit 170 to perform the erase operation of a memory block selected by the address ADD.

The control circuit 180 may include a precharge controller 180A. The precharge controller 180A may be implemented as hardware, software, or a combination of hardware and software. For example, the precharge controller 180A may be a precharge controller circuit operating in accordance with an algorithm and/or a processor executing precharge controller code. The precharge controller 180A may be configured to monitor a program operation performed in a selected page and to change a precharge mode or to select a precharge mode according to a monitoring result. For example, the precharge controller may be configured to monitor target voltages of the memory cells in the program operation, compare a selected target voltage among the target voltages with a reference voltage, and change the precharge mode according to a comparison result. For example, in the program operation performed in the selected page, the precharge controller 180A may be configured to compare a target voltage and a reference voltage with each other and to change the operation code OPCD according to a comparison result. For example, when the target voltage is equal to or lower than the reference voltage, the precharge controller 180A may change the operation code OPCD such that strings are precharged in a turn-on precharge mode. When the target voltage is higher than the reference voltage, the precharge controller 180A may change the operation code OPCD such that strings are precharged in a gate induced drain leakage (GIDL) precharge mode. In the turn-on precharge mode, a turn-on voltage having a positive voltage is applied to the source select lines SSL. In the GIDL precharge mode, a negative voltage is applied to the source select lines SSL.

Figure 2:
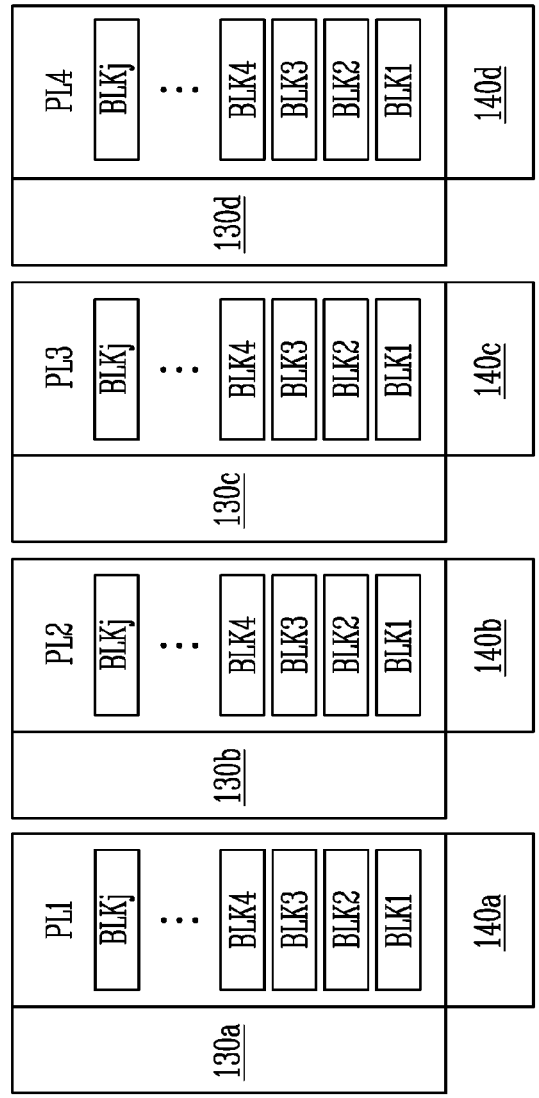
FIG. 2 is a diagram illustrating a memory cell array.

FIG. 2 is a diagram illustrating the memory cell array.

Referring to FIG. 2, when the memory cell array (110 shown in FIG. 1) is configured in a multi-plane structure, the row decoder group (130 shown in FIG. 1) and the page buffer group (140 shown in FIG. 1) may include row decoders and page buffers, which are respectively connected to the planes included in the memory cell array 110. For example, when first to fourth planes PL1 to PL4 are included in the memory cell array 110, the row decoder group 130 may include first to fourth row decoders 130a to 130d respectively connected to the first to fourth planes PL1 to PL4, and the page buffer group 140 may include first to fourth page buffers 140a to 140d respectively connected to the first to fourth planes PL1 to PL4. The first row decoder 130a and the first page buffer 140a are connected to the first plane PL1, the second row decoder 130b and the second page buffer 140b are connected to the second plane PL2, the third row decoder 130c and the third page buffer 140c are connected to the third plane PL3, and the fourth row decoder 130d and the fourth page buffer 140d are connected to the fourth plane PL4.

Therefore, the first row decoder 130a may select one memory block among first to jth memory blocks BLK1 to BLKj included in the first plane PL1, and the first page buffer 140a may transmit data through bit lines connected to the selected memory block. For example, operating voltages may be applied through drain select lines, word lines, source select lines and a source line, which are connected to the selected memory block in the first plane PL1, and drain select lines, word lines, and source select lines of the other unselected memory blocks except the selected memory block among the first to jth memory blocks BLK1 to BLKj included in the first plane PL1 may be floated.

First to jth memory blocks BLK1 to BLKj included in each of the other second to fourth planes PL2 to PL4 may also be selected or unselected by the second to fourth row decoders 130b to 130d and the second to fourth page buffers 140b to 140d.

In a program, read or erase operation, all of the first to fourth planes PL1 to PL4 or only some of the first to fourth planes PL1 to PL4 may be selected by the first to fourth row decoders 130a to 130d and the first to fourth page buffers 140a to 140d. For example, when the first plane PL1 is selected and the other second to fourth planes PL2 to PL4 are unselected, one memory block among the first to jth memory blocks BLK1 to BLKj included in the first plane PL1 may be selected. First to jth memory blocks BLK1 to BLKj included in the unselected second to fourth planes PL2 to PL4 all become unselected memory blocks. For example, when first and third planes PL1 and PL3 are selected and the other second and fourth planes PL2 and PL4 are unselected, one memory block among the first to jth memory blocks BLK1 to BLKj included in the first plane PL1 may be selected, and one memory block among the first to jth memory blocks BLK1 to BLKj included in the third plane PL3 may be selected. The first to jth memory blocks BLK1 to BLKj included in the unselected second and fourth planes PL2 and PL4 all become unselected memory blocks. When the first to fourth planes PL1 to PL4 are all selected, one memory block among the first to jth memory blocks BLK1 to BLKj included in each of the first to fourth planes PL1 to PL4 may be selected.

Since the selected memory blocks in the first to fourth planes PL1 to PL4 are selected by the first to fourth row decoders 130a to 130d, the selected memory blocks may have different addresses. For example, the first memory block BLK1 may be selected in the first plane PL1, and the fourth memory block BLK4 may be selected in the third plane PL3.

Figure 3:
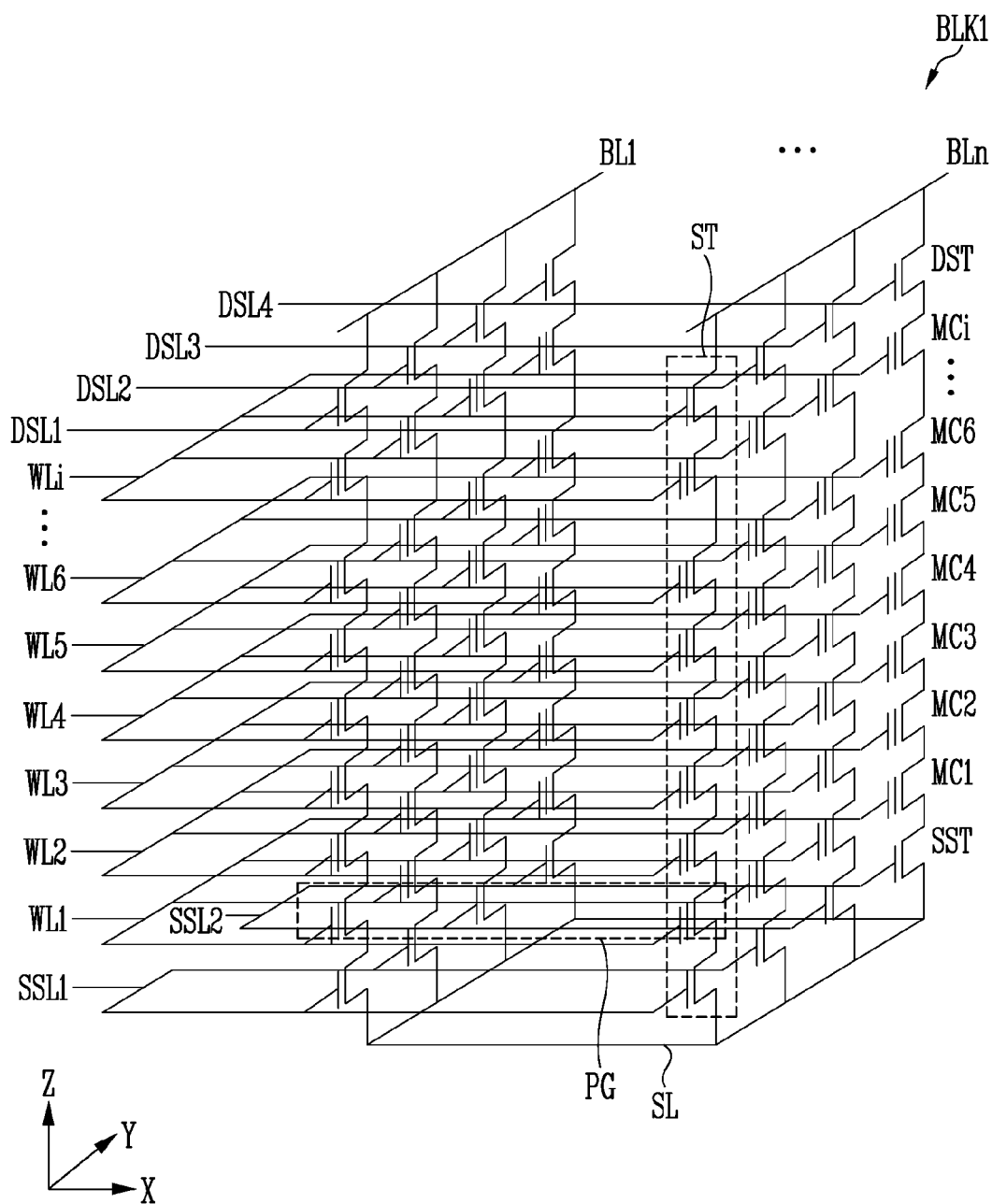
FIG. 3 is a circuit diagram illustrating any one memory block among memory blocks shown in FIG. 2.

FIG. 3 is a circuit diagram illustrating any one memory block among the memory blocks shown in FIG. 2.

Referring to FIG. 3, the first memory block BLK1 includes strings ST connected between first to nth bit lines BL1 to BLn and a source line SL. The first to nth bit lines BL1 to BLn extend along a Y direction and are spaced apart from each other along an X direction. Therefore, the strings ST may extend along a Z direction and are spaced apart from each other along the X and Y directions.

Any one string ST among strings ST connected to the nth bit line BLn will be described as an example. The string ST may include a source select transistor SST, first to ith memory cells MC1 to MCi, and a drain select transistor DST. The first memory block BLK1 shown in FIG. 3 is a drawing schematically illustrating a structure of a memory block, and therefore, numbers of source select transistor SST, first to ith memory cells MC1 to MCi, and drain select transistors DST, which are included in the strings ST, may be changed according to a memory device.

Gates of source select transistors SST included in different strings ST may be connected to a source select line SSL, gates of first to ith memory cells MC1 to MCi included in the different strings ST may be connected to first to ith word lines WL1 to WLi, and gates of drain select transistors DST included in the different strings ST may be connected to a drain select line DSL.

Memory cells formed in the same layer among the first to ith memory cells MC1 to MCi may be connected to the same word line. For example, first memory cells MC1 included in different strings ST may be commonly connected to the first word line WL1, and ith memory cells MCi included in the different strings ST may be commonly connected to the ith word line WLi. A group of memory cells which are included in different strings ST and are connected to the same word line becomes a page PG. Program and read operations may be performed in units of pages PG, and an erase operation may be performed in units of memory blocks.

Figure 4:
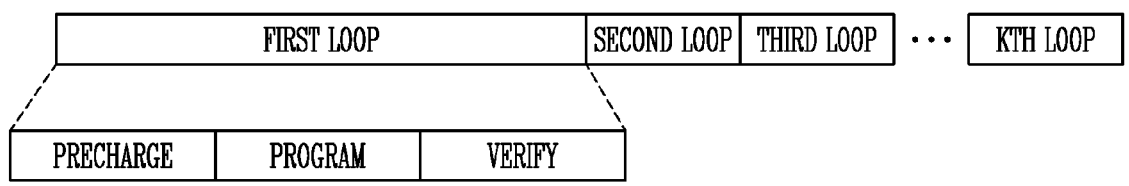
FIG. 4 is a diagram illustrating phases performed in a program operation.

FIG. 4 is a diagram illustrating phases performed in a program operation.

Referring to FIG. 4, the program operation is configured with first to kth loops. The first to kth loops may be performed until a threshold voltage of selected memory cells reaches a target voltage. Each of the first to kth loops may be configured with similar phases. For example, the first loop may be configured with a precharge phase, a program phase, and a verify phase. Each phase will be described in detail as follows.

The precharge phase is a phase of increasing a channel voltage of unselected strings.

A selected memory block includes a plurality of strings. According to data to be programmed in memory cells, some of the plurality of strings become selected strings, and the others of the plurality of strings become unselected strings. The selected strings are strings in which selected memory cells to be programmed are included, and the unselected strings are strings in which unselected memory cells not to be programmed are included. The selected memory cells and the unselected memory cells may be connected to a selected word line. Since a program voltage is applied to the selected word line in the program phase, a channel voltage is to be low to have a high voltage difference between the program voltage and a channel in the selected strings. A channel voltage is to be high to have a low voltage difference between the program voltage and a channel in the unselected strings. Therefore, in the precharge phase, channel boosting for increasing the channel voltage of the unselected strings may be performed. The channel boosting may be performed in a mode in which a precharge voltage supplied to a bit line or a source line is transferred to a string. The precharge voltage has a positive voltage higher than 0V. In this embodiment, a mode in which a source select transistor is turned on and a mode using gate induced drain leakage (GIDL) may be selectively used to transfer, to the string, the precharge voltage supplied to the source line.

The program phase is a phase of increasing a threshold voltage of selected memory cells.

When the channel voltage of the unselected strings is increased in the precharge phase, the program phase may be performed. In the program phase, the program voltage is applied to the selected word line to increase the threshold voltage of the selected memory cells. The program voltage may be stepwise increased as a number of times a loop is performed increases. For example, a program voltage used in the program phase of the first loop may be lowest, and a program voltage used in a program phase of the kth loop in which the program operation is ended may be highest. When the program voltage is applied to the selected word line, a pass voltage may be applied to unselected word lines.

The verify phase is a phase of determining whether the threshold voltage of the selected memory cells has been increased to the target voltage.

In the verify phase, a verify voltage may be applied to the selected word line, and the pass voltage may be applied to the unselected word lines. The verify voltage may be changed according to the target voltage of the selected memory cells. In the verify phase, when the threshold voltage of the selected memory cells are increased to the target voltage or higher, the target voltage may be changed to a next target voltage. When each of threshold voltages of selected memory cells included in a selected page are increased to a target voltage, the program operation of the selected page may be ended.

Figure 5:
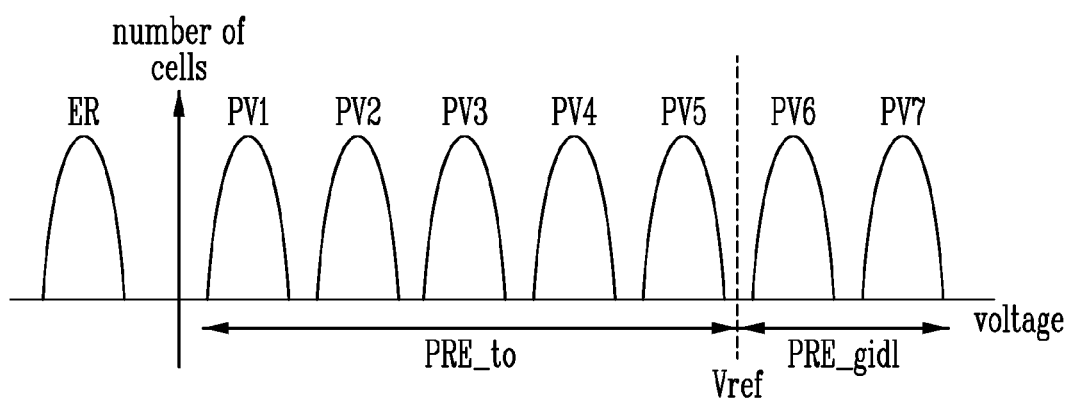
FIG. 5 is a diagram illustrating a precharge phase in accordance with an embodiment of the present disclosure.

FIG. 5 is a diagram illustrating a precharge phase in accordance with an embodiment of the present disclosure.

Referring to FIG. 5, in this embodiment, a turn-on precharge mode PRE_to and a GIDL precharge mode PRE_gidl may be selectively used in the precharge phase. A program operation using a triple level cell mode in which three-bit data can be stored in one memory cell will be described as an example.

In the triple level cell mode, the state of memory cells may be divided into eight states ER and PV1 to PV7 according to a threshold voltage thereof. For example, the memory cells may have an erase state ER in which the threshold voltage is lowest or any one state among first to seventh program states PV1 to PV7 higher than the erase state ER. The first program state PV1 is a state in which the threshold voltage is lowest among the first to seventh program states PV1 to PV7, and the seventh program state PV7 is a state in which the threshold voltage is highest among the first to seventh program states PV1 to PV7. Therefore, a relatively low program voltage is used in a program operation of memory cells to be programmed to the first program state PV1 among selected memory cells included in a selected page, and a relative high program voltage is used in a program operation of memory cells to be programed to the seventh program state PV7 among the selected memory cells included in the selected page. In an embodiment, an intermediate voltage may be between an erase state or relatively low program state and a relatively higher program state. For example, the intermediate voltage may be between the erase state ER or first program state PV1 and a seventh program state PV7 as shown in FIG. 5.

The turn-on precharge mode PRE_to may be used in a program operation of states in which the threshold voltage is equal to or lower than a reference voltage Vref among the first to seventh program states PV1 to PV7, and the GIDL precharge mode PRE_gidl may be used in a program operation of states in which the threshold voltage is higher than the reference voltage Vref among the first to seventh program states PV1 to PV7.

Since the turn-on precharge mode PRE_to is a mode in which a precharge voltage supplied to the source line is transferred to an unselected string by turning on source select transistors, the time required to perform the precharge phase may be reduced in a program loop to which the turn-on precharge mode PRE_to is applied. However, since the precharge voltage supplied to the source line is rapidly transferred to the unselected string in the turn-on precharge mode PRE_to, a sharp voltage difference may occur in a channel. Therefore, a threshold voltage of memory cells included in the unselected string may be influenced by channel boosting, so that occurrence of a disturbance increases. The disturbance means a change in unintended data. Therefore, the disturbance may occur in proportion to a program voltage. For example, as the program voltage increases, the probability that the disturbance will occur may increase.

Since the GIDL precharge mode PRE_gidl is a mode in which a precharge voltage supplied to the source line is transferred to a string by using a leakage current of the source select transistor, the time required to perform the precharge phase may increase in a program loop to which the GIDL precharge mode PRE_gidl is applied. However, since the precharge voltage supplied to the source line is slowly transferred to the unselected string in the GIDL precharge mode PRE_gidl, a voltage difference gentler than the voltage difference in the turn-on precharge mode PRE_to may occur in the channel. Therefore, the occurrence of a disturbance may be decreased in the GIDL precharge mode PRE_gidl.

The reference voltage Vref may be set by considering advantages and disadvantages of each of the turn-on precharge mode PRE_to and the GIDL precharge mode PRE_gidl. For example, the reference voltage Vref may be set in a section higher than a middle state among the first to seventh program states PV1 to PV7. For example, the reference voltage Vref may be set at a voltage higher than a voltage in the fourth program state PV4. When the reference voltage Vref is set between threshold voltage distributions of the fifth and sixth program state PV5 and PV6, the turn-on precharge mode PRE_to may be used in a program operation of the first to fifth program states PV1 to PV5, and the GIDL precharge mode PRE_gidl may be used in a program operation of the sixth and seventh program states PV6 and PV7. That is, since the turn-on precharge mode PRE_to is used in the program operation of the first to fifth program states PV1 to PV5, the time required to perform the program operation can be reduced. Since the GIDL precharge mode PRE_gidl is used in the program operation of the sixth and seventh program states PV6 and PV7, the occurrence of a disturbance can be decreased.

FIG. 6 is a diagram illustrating a program operation in accordance with an embodiment of the present disclosure.

Referring to FIGS. 1 and 6, when a program operation of a selected page is started, the precharge controller 180A may determine whether a target voltage PV is higher than a reference voltage Vref (S61). The reference voltage Vref may be preset in the precharge controller 180A, and be differently set by considering a program operation time and a disturbance according to a memory device. The word "preset" as used herein with respect to a parameter, such as a preset reference voltage Vref, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

When the target voltage PV is equal to or lower than the reference voltage Vref (NO), a precharge phase of unselected strings may be performed in the turn-on precharge mode PRE_to (S62). For example, the precharge controller 180A may output an operation code OPCD according to the turn-on precharge mode PRE_to, and the voltage generator 120 may output operating voltages Vop in response to the operation code OPCD. The word line voltage generator WLG may generate a pass voltage applied to the word lines WL in response to the operation code OPCD. The select line voltage generator STG may generate a turn-on voltage as a positive voltage applied to the drain select lines DSL and the source select lines SSL in response to the operation code OPCD. The source line voltage generator SLG may generate a precharge voltage as a positive voltage applied to the source line SL in response to the operation code OPCD.

When the target voltage PV is greater than the reference voltage Vref (YES), the precharge phase of the unselected strings may be performed in the GIDL precharge mode PRE_gidl (S63). For example, the precharge controller 180A may output an operation code OPCD according to the GIDL precharge mode PRE_gidl, and the voltage generator 120 may output operating voltages Vop in response to the operation code OPCD. The word line voltage generator WLG may generate a pass voltage applied to the word lines WL in response to the operation code OPCD. The select line voltage generator STG may generate a turn-on voltage as a positive voltage applied to the drain select lines DSL and generate a negative voltage applied to the source select lines SSL in response to the operation code OPCD. The source line voltage generator SLG may generate a precharge voltage as a positive voltage applied to the source line SL in response to the operation code OPCD.

When a channel voltage of the unselected strings is increased in the step S62 or S63, a program phase may be performed (S64). In the program phase, a program voltage may be applied to a selected word line. For example, the word line voltage generator WLG may generate the program voltage having different levels according to a loop. When the program voltage is applied to the selected word line, a threshold voltage of selected memory cells included in selected strings may be increased.

When the program voltage is applied to the selected word line for a certain time, a verify phase may be performed (S65). In the verify phase, a verify voltage may be applied to the selected word line. The word line voltage generator WLG may generate the verify voltage of which level varies according to a target voltage of the selected memory cells.

When it is determined that the threshold voltage of the selected memory cells is increased to the target voltage in the verify phase (S65), the program operation of the selected memory cells may be ended.

Figure 7A:
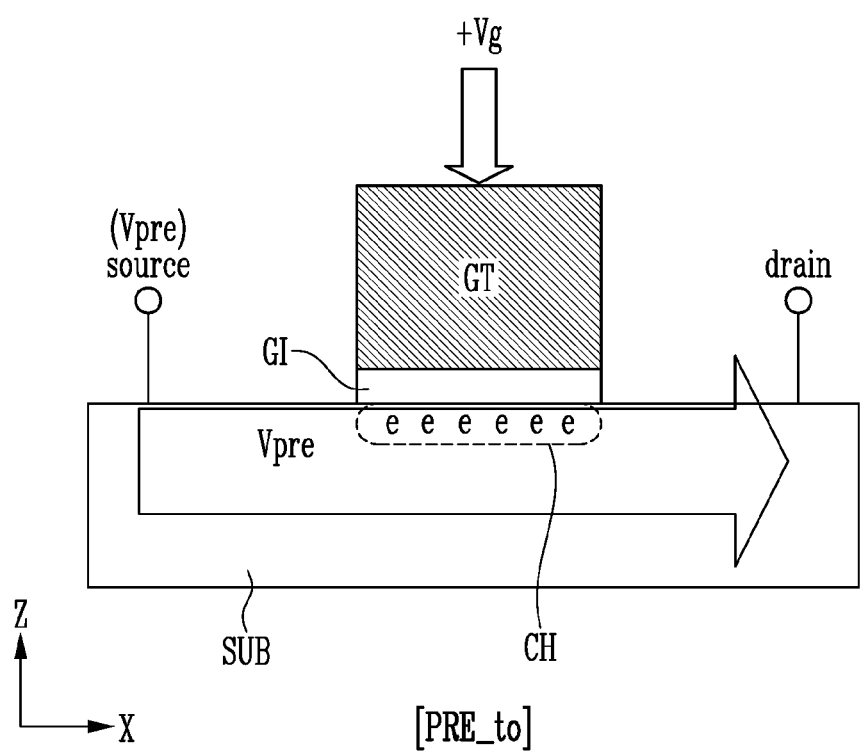
FIGS. 7A and 7B are diagrams illustrating a turn-on precharge mode.
Figure 7B:
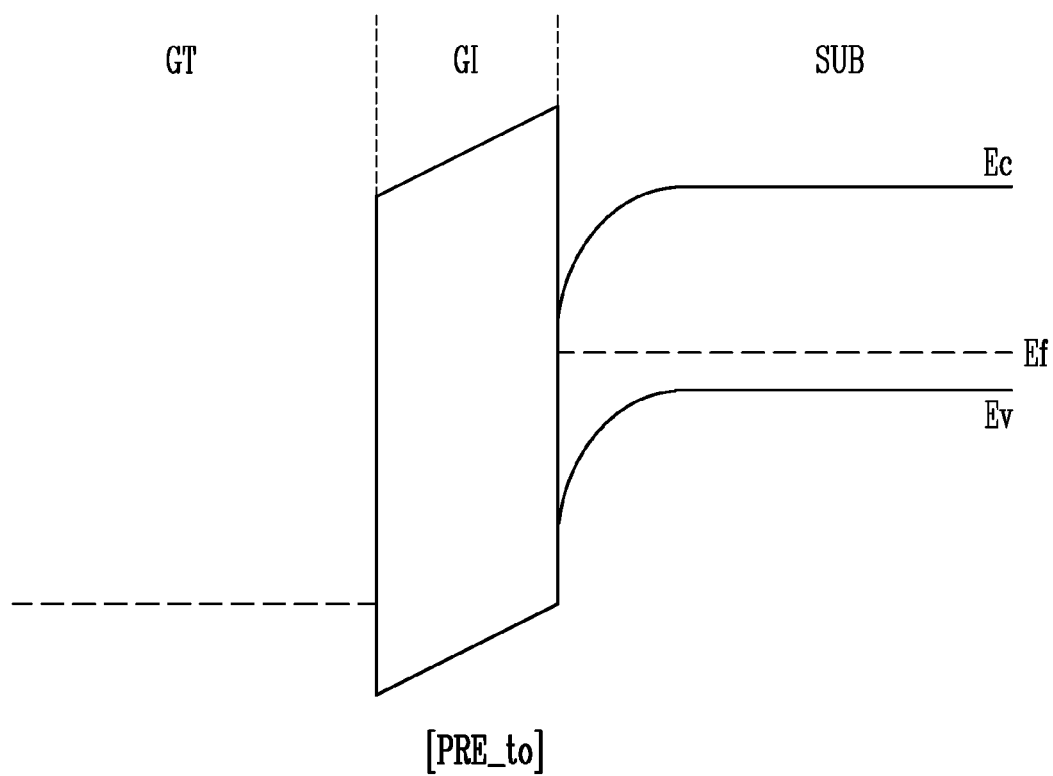

FIGS. 7A and 7B are diagrams illustrating the turn-on precharge mode. FIG. 7A illustrates a section of a transistor, and FIG. 7B illustrates an energy band of the transistor.

Referring to FIGS. 7A and 7B, the transistor may include a gate insulating layer GI and a gate GT, which are formed on a substrate SUB, and a source and a drain, which are formed in the substrate SUB. When a precharge voltage Vpre is supplied to the source, and a gate voltage +Vg as a positive voltage is applied to the gate GT, a valence band Ev and a conduction band Ec are increased, and therefore, a Fermi level Ef is also increased. Since a channel CH electrically connecting the source and the drain to each other is formed in the substrate SUB, a precharge voltage Vpre supplied to the source may be transmitted to the drain through the channel CH. In order to form the channel in the substrate SUB, the gate voltage +Vg as the positive voltage is to be higher than a threshold voltage of the transistor.

Figure 8:
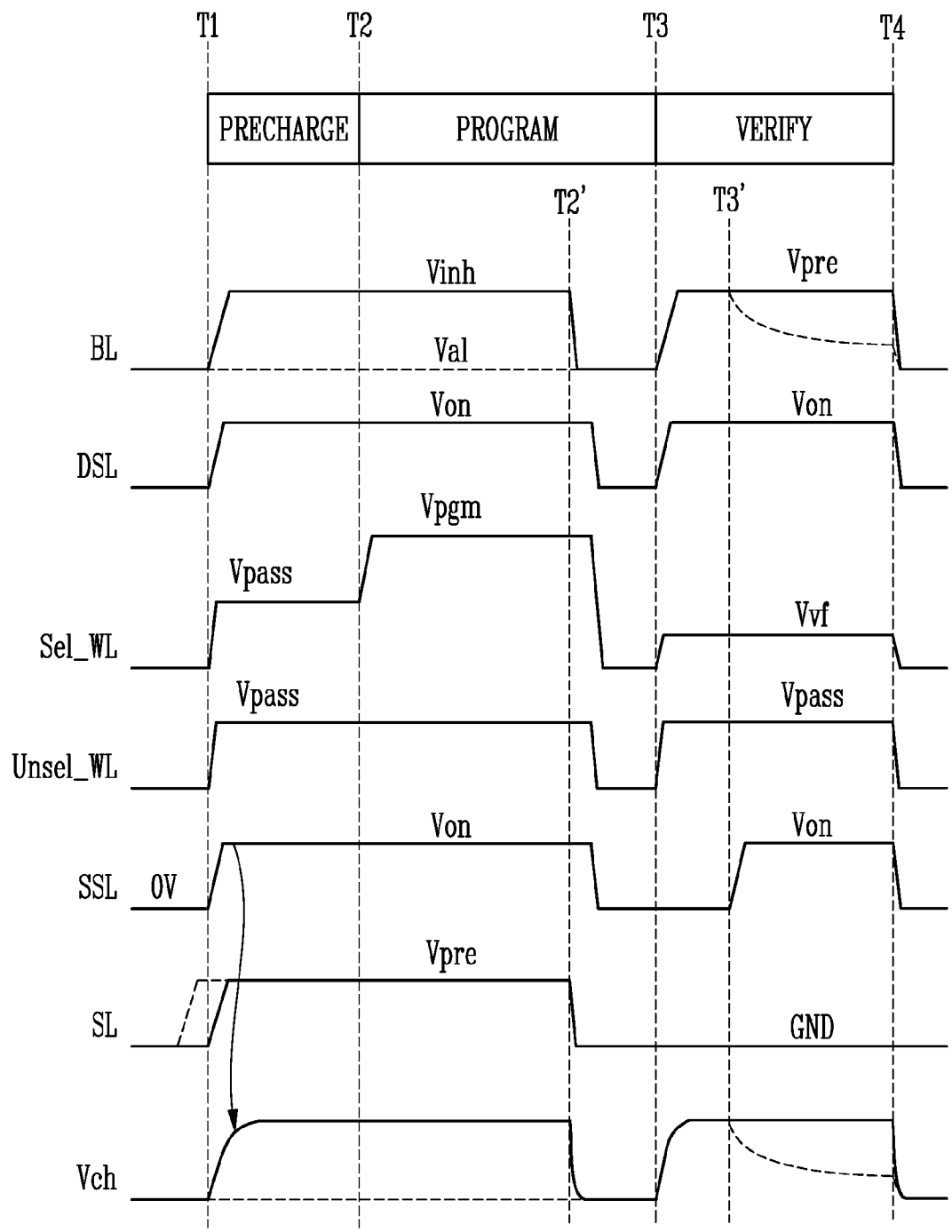
FIG. 8 is a diagram illustrating a program operation to which the turn-on precharge mode is applied.

FIG. 8 is a diagram illustrating a program operation to which the turn-on precharge mode is applied.

Referring to FIG. 8, an operation method of any one loop among a plurality of loops performed in the program operation is illustrated. For example, when assuming that one loop is performed in a period T1 to T4, a precharge phase may be performed in a period T1 to T2, a program phase may be performed in a period T2 to T3, and a verify phase may be performed in a period T3 to T4.

When the precharge phase is started (T1), a precharge voltage Vpre may be supplied to the source line SL, and a program allow voltage Val or a program inhibit voltage Vinh may be applied to the bit lines BL. The precharge voltage Vpre supplied to the source line SL may have a positive voltage, and be supplied to the source line SL before a time T1. The program allow voltage Val may be supplied to selected bit lines among the bit lines BL, and the program inhibit voltage Vinh may be supplied to unselected bit lines among the bit lines BL. The program allow voltage Val may be set as 0V or a negative voltage, and the program inhibit voltage Vinh may be set as a positive voltage. In order to form a channel in unselected strings, a pass voltage Vpass may be applied to a selected word line Sel_WL and unselected word lines Unsel_WL. The pass voltage Vpass may be set as a positive voltage at which memory cells can be turned on.

A turn-on voltage Von may be applied to the drain select line DSL and the source select line SSL. The turn-on voltage Von may be set as a positive voltage at which drain select transistors and source select transistors can be turned on. For example, when the turn-on voltage Von is applied to the drain select line DSL, a channel may be formed in a drain select transistor connected to the drain select line DSL. When the channel is formed, the drain select transistor is turned on, and hence the program inhibit voltage Vinh supplied to the unselected bit lines may be applied to the unselected strings. When the turn-on voltage Von is applied to the source select line SSL, a channel may be formed in a source select transistor connected to the source select line SSL. When the channel is formed, the source select transistor is turned on, and hence the precharge voltage Vpre supplied to the source line SL may be applied to the unselected strings. Therefore, a channel voltage Vch of the unselected strings may be increased. When the channel voltage Vch becomes equal to the program inhibit voltage Vinh or the precharge voltage Vpre, the drain select transistor and the source select transistor are turned off, and therefore, channels of the unselected strings may be floated. In a state in which the channels are floated, when the pass voltage Vpass applied to the selected word line Sel_WL and the unselected word lines Unsel_WL is maintained, boosting may occur in the channels due to coupling to the pass voltage Vpass, so that the channel voltage Vch is further increased.

When the program phase is started (T2), a program voltage Vpgm higher than the pass voltage Vpass may be applied to the selected word line Sel_WL. When the program voltage Vpgm is applied to the selected word line Sel_WL, a threshold voltage of selected memory cells among memory cells connected to the selected word line Sel_WL may be increased. Programming of unselected cells may be inhibited by the increased channel voltage Vch. When the program voltage Vpgm is applied for a certain time (T2'), a discharge operation may be performed until T3 at which the verify phase is started (T2' to T3). For example, a discharge operation for lowering a voltage of the bit lines BL and the source line may be performed at a time T2, and a discharge operation for lowering a voltage of the drain select line, the selected word line Sel_WL, the unselected word lines Unsel_WL, and the source select line SSL may be subsequently performed. Since the channel voltage Vch is lowered by the discharge operation, channels in selected strings and the unselected strings may be initialized. A discharge time of the bit lines BL, the source line SL, the drain select line DSL, the selected word line Sel_WL, the unselected word line Unsel_WL, and the source select line SSL may be changed in a period T2' to T3.

When the verify phase is started (T3), the precharge voltage Vpre may be applied to the bit lines BL, and the source line SL may be grounded (GND). A verify voltage Vvf may be applied to the selected word line Sel_WL, and the pass voltage Vpass may be applied to the unselected word lines Unsel_WL. The turn-on voltage Von as a positive voltage may be applied to the drain select line DSL. The channel voltage Vch may be increased by the precharge voltage Vpre applied to the bit lines BL. Subsequently, when the turn-on voltage Von as the positive voltage is applied to the source select line SSL, the channel voltage Vch may be decreased or be maintained as a previous voltage according to the threshold voltage of the selected memory cells. For example, the channel voltage Vch may be decreased in strings of memory cells having a threshold voltage lower than the verify voltage Vvf. The channel voltage Vch may be maintained as the previous voltage in strings of memory cells having a threshold voltage higher than the verify voltage Vvf. Since the drain select transistors and the source select transistors are turned on, the voltage of the bit lines BL may be decreased according to the channel voltage Vch or be maintained as a previous voltage.

Figure 9A:
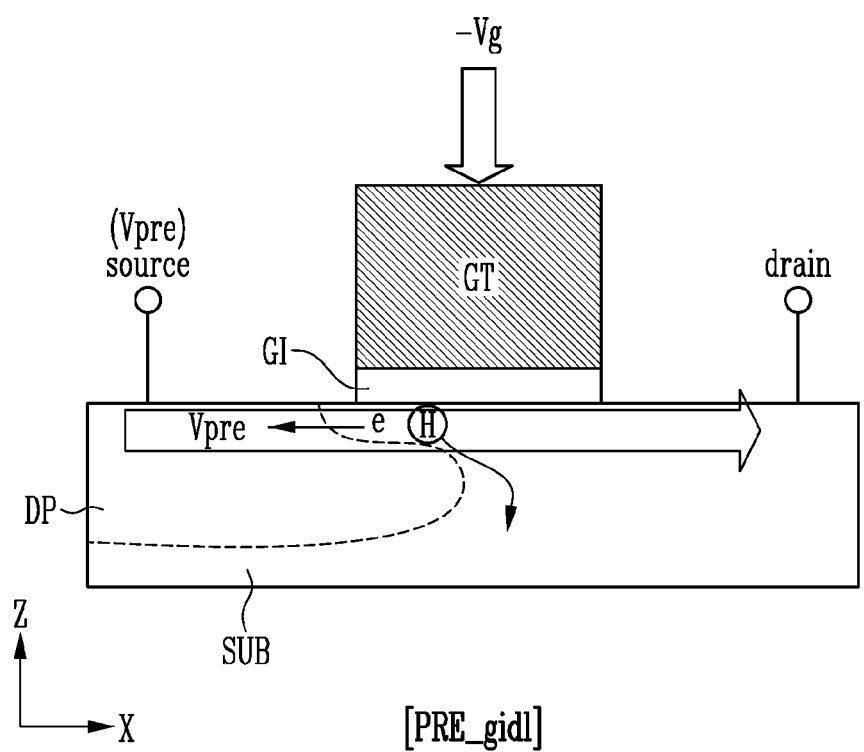
FIGS. 9A and 9B are diagrams illustrating a gate induced drain leakage (GIDL) precharge mode.
Figure 9B:
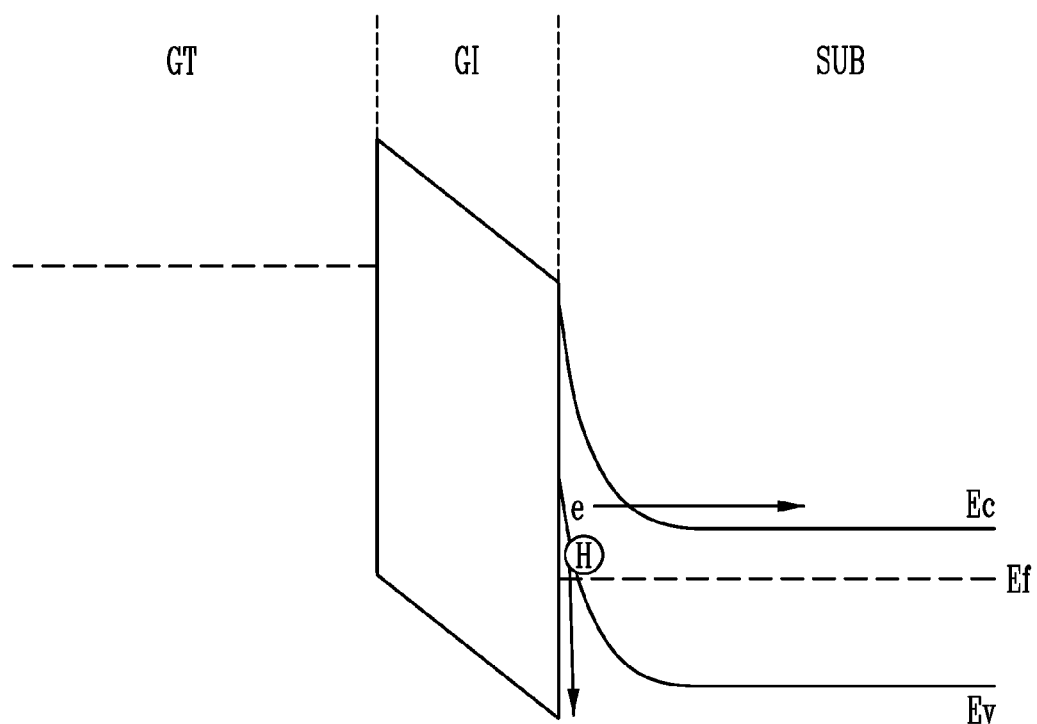

FIGS. 9A and 9B are diagrams illustrating the GIDL precharge mode. FIG. 9A illustrates a section of the transistor, and FIG. 9B illustrates an energy band of the transistor.

Referring to FIGS. 9A and 9B, when a precharge voltage is supplied to the source, and a gate voltage -Vg as a negative voltage is applied to the gate GT, energy of the gate GT becomes higher than energy of the substrate SUB, and therefore, the valence band Ev and the conduction band Ec of the substrate SUB is decreased. As the gate voltage -Vg applied to the gate GT is decreased, the valence band Ev and the conduction band Ec of the substrate SUB are decreased. A portion at which energy levels of the valence band Ev and the conduction band Ec are similar to each other occurs. Band-to-band tunneling in which electrons (e) existing in the valence band Ev can be moved to the conduction band Ec occurs, and hence current can flow.

In other words, when the gate voltage -Vg having a sufficient negative level is applied to the gate GT in a state in which a positive voltage is applied to the source, a depletion layer DP of a source region may be bent toward a lower portion of the gate GT. While a strong electric field is applied to the substrate SUB between the depletion layer DP and the gate insulating layer GI, gate induced drain leakage (GIDL) may occur. Therefore, when 0V or a negative voltage having a weak level is applied to the gate GT, the transistor is maintained in a turn-off state. However, when a negative voltage having a high level is applied to the gate GT, a leakage current occurs in the transistor, and therefore, the precharge voltage having a low level may be transferred to the drain.

FIG. 10 is a diagram illustrating a program operation to which the GIDL precharge mode is applied.

Referring to FIG. 10, an operation method of any one loop among a plurality of loops performed in the program operation is illustrated. For example, when assuming that one loop is performed in a period T1 to T4, a precharge phase may be performed in a period T1 to T2", a program phase may be performed in a period T2" to T3, and a verify phase may be performed in a period T3 to T4.

When the precharge phase is started (T1), a precharge voltage Vpre may be supplied to the source line SL, and a program allow voltage Val or a program inhibit voltage Vinh may be applied to the bit lines BL. The precharge voltage Vpre supplied to the source line SL may have a positive voltage, and be supplied to the source line SL before a time T1. The program allow voltage Val may be supplied to selected bit lines among the bit lines BL, and the program inhibit voltage Vinh may be supplied to unselected bit lines among the bit lines BL. The program allow voltage Val may be set as 0V or a negative voltage, and the program inhibit voltage Vinh may be set as a positive voltage. In order to form a channel in unselected strings, a pass voltage Vpass may be applied to a selected word line Sel_WL and unselected word lines Unsel_WL. The pass voltage Vpass may be set as a positive voltage at which memory cells can be turned on.

A turn-on voltage Von may be applied to the drain select line DSL. The turn-on voltage Von may be set as a positive voltage at which drain select transistors can be turned on. For example, the turn-on voltage Von is applied to the drain select line DSL, a channel may be formed in a drain select transistor connected to the drain select line DSL. When the channel is formed, the drain select transistor is turned on, and therefore, the program inhibit voltage Vinh supplied to the unselected bit lines may be applied to unselected strings.

A negative voltage Vneg lower than 0V may be applied to the source select line SSL. The negative voltage Vneg may have a negative level at which gate induced drain leakage (GIDL) may occur in source select transistors. A time required for a channel voltage Vch to be increased by the GIDL may be longer than a time in the turn-on precharge mode. Therefore, a time T1 to T2" required to perform the precharge phase in a loop to which the GIDL precharge mode is applied is longer than the time T1 to T2 required to perform the precharge phase in a loop to which the turn-on precharge mode is applied. However, in the GIDL precharge mode, the channel voltage Vch is gradually increased, and hence any high voltage difference is not applied to the memory cells. Thus, in an embodiment, occurrence of a disturbance in the program operation can be reduced.

When the program phase is started (T2"), a program voltage Vpgm higher than the pass voltage Vpass may be applied to the selected word line Sel_WL. When the program voltage Vpgm is applied to the selected word line Sel_WL, a threshold voltage of selected memory cells among memory cells connected to the selected word line Sel_WL may be increased. Programming of unselected cells may be inhibited by the increased channel voltage Vch. When the program voltage Vpgm is applied for a certain time (T2'), a discharge operation may be performed until T3 at which the verify phase is started (T2' to T3). For example, a discharge operation for lowering a voltage of the bit lines BL and the source line may be performed at a time T2', and a discharge operation for lowering a voltage of the drain select line, the selected word line Sel_WL, and the unselected word lines Unsel_WL may be subsequently performed. Since the negative voltage Vneg is applied to the source select line SSL, the voltage applied to the source select line SSL may be increased to 0V from the negative voltage Vneg, while the discharge operation is performed (T2' to T3).

Since the channel voltage Vch is decreased by the discharge operation, channels of selected strings and the unselected strings may be initialized. A time at which the source line SL, the drain select line DSL, the selected word line Sel_WL, and the unselected word lines Unsel_WL are discharged and a time at which the voltage of the source select line SSL is increased may be changed within the period T2' to T3.

When the verify phase is started (T3), the precharge voltage Vpre may be applied to the bit lines BL, and the source line SL may be grounded. A verify voltage Vvf may be applied to the selected word line Sel_WL, and the pass voltage Vpass may be applied to the unselected word lines Unsel_WL. The turn-on voltage Von as a positive voltage may be applied to the drain select line DSL. The channel voltage Vch may be increased by the precharge voltage Vpre applied to the bit lines BL. Subsequently, when the turn-on voltage Von as the positive voltage is applied to the source select line SSL, the channel voltage Vch may be decreased or be maintained as a previous voltage according to the threshold voltage of the selected memory cells. For example, the channel voltage Vch may be decreased in strings of memory cells having a threshold voltage lower than the verify voltage Vvf. The channel voltage Vch may be maintained as the previous voltage in strings of memory cells having a threshold voltage higher than the verify voltage Vvf. Since the drain select transistors and the source select transistors are turned on, the voltage of the bit lines BL may be decreased according to the channel voltage Vch or be maintained as a previous voltage.

Figure 11:
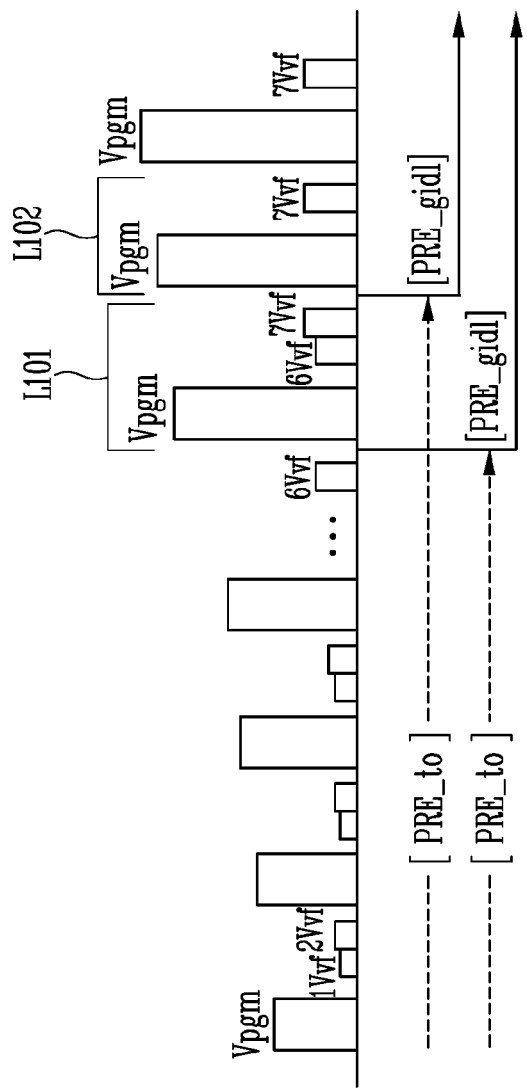
FIG. 11 is a diagram illustrating a time at which the GIDL precharge mode is applied.

FIG. 11 is a diagram illustrating a time at which the GIDL precharge mode is applied.

Referring to FIG. 11, in an embodiment, in order to decrease an operation time of a program operation of a selected page and reduce occurrence of a disturbance, the turn-on precharge mode PRE_to and the GIDL precharge mode PRE_gidl may be selectively applied in the program operation. For example, since a program voltage is low in an initial period of the program operation, it is difficult that a disturbance will occur. Therefore, the turn-on precharge mode PRE_to may be applied to decrease a time required to perform the program operation in the initial period of the program operation, and the GIDL precharge mode PRE_gidl may be applied to reduce the occurrence of a disturbance in a latter period of the program operation.

A time for which the GIDL precharge mode PRE_gidl is applied may be determined according to the reference voltage Vref as illustrated in the embodiment described with reference to FIG. 6, but the GIDL precharge mode PRE_gidl may be applied in only a program operation of a highest program state among the program states. For example, it is assumed that the seventh program state is a highest program state, and a verify voltage corresponding to the seventh program state is a seventh verify voltage 7Vvf. Although a sixth verify voltage 6Vvf is used, the GIDL precharge mode PRE_gidl may be applied from a loop L101 in which the seventh verify voltage 7Vvf is used for the first time. In another example, the GIDL precharge mode PRE_gidl may be applied from a loop L102 in which only the seventh verify voltage 7Vvf starts being used. The turn-on precharge mode PRE_to may be applied in loops until before the GIDL precharge mode PRE_gidl is applied.

Figure 12:
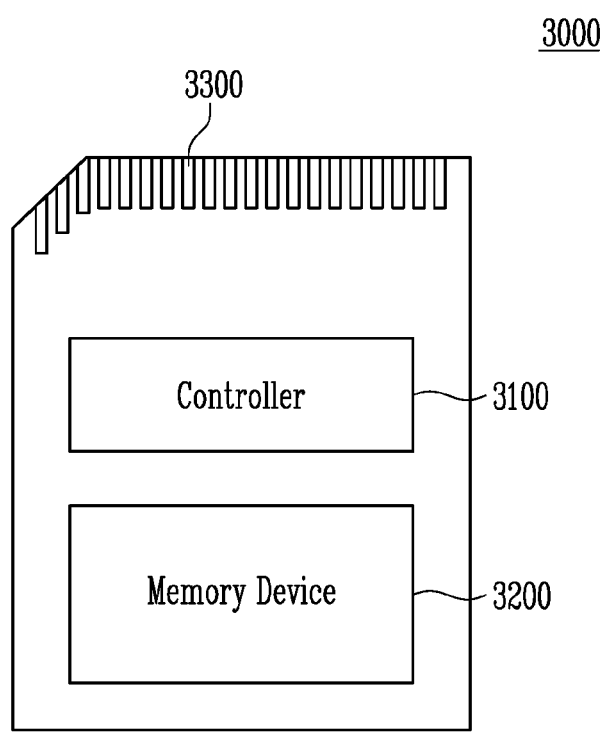
FIG. 12 is a diagram illustrating a memory card system to which the memory device of the present disclosure is applied.

FIG. 12 is a diagram illustrating a memory card system to which the memory device of the present disclosure is applied.

Referring to FIG. 12, the memory card system 3000 includes a controller 3100, a memory device 3200, and a connector 3300.

The controller 3100 may be connected to the memory device 3200. The controller 3100 may access the memory device 3200. For example, the controller 3100 may control a program, read or ease operation, or control a background operation of the memory device 3200. The controller 3100 may provide an interface between the memory device 3200 and a host. The controller 3100 may drive firmware for controlling the memory device 3200. For example, the controller 3100 may include components such as a Random Access Memory (RAM), a processing unit, a host interface, a memory interface, and the error corrector.

The controller 3100 may communicate with an external device through the connector 3300. The controller 3100 may communicate with the external device (e.g., the host) according to a specific communication protocol. For example, the controller 3100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. Exemplarily, the connector 3300 may be defined by at least one of the above-described various communication protocols.

The memory device 3200 may include memory cells, and be configured identically to the memory device 100 shown in FIG. 1. Therefore, the memory device 3200 may perform a program operation by selectively applying the turn-on precharge mode and the GIDL precharge mode.

The controller 3100 and the memory device 3200 may be integrated into a single semiconductor device, to constitute a memory card. For example, the controller 3100 and the memory device 3200 may constitute a memory card such as a personal computer (PC) card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 13:
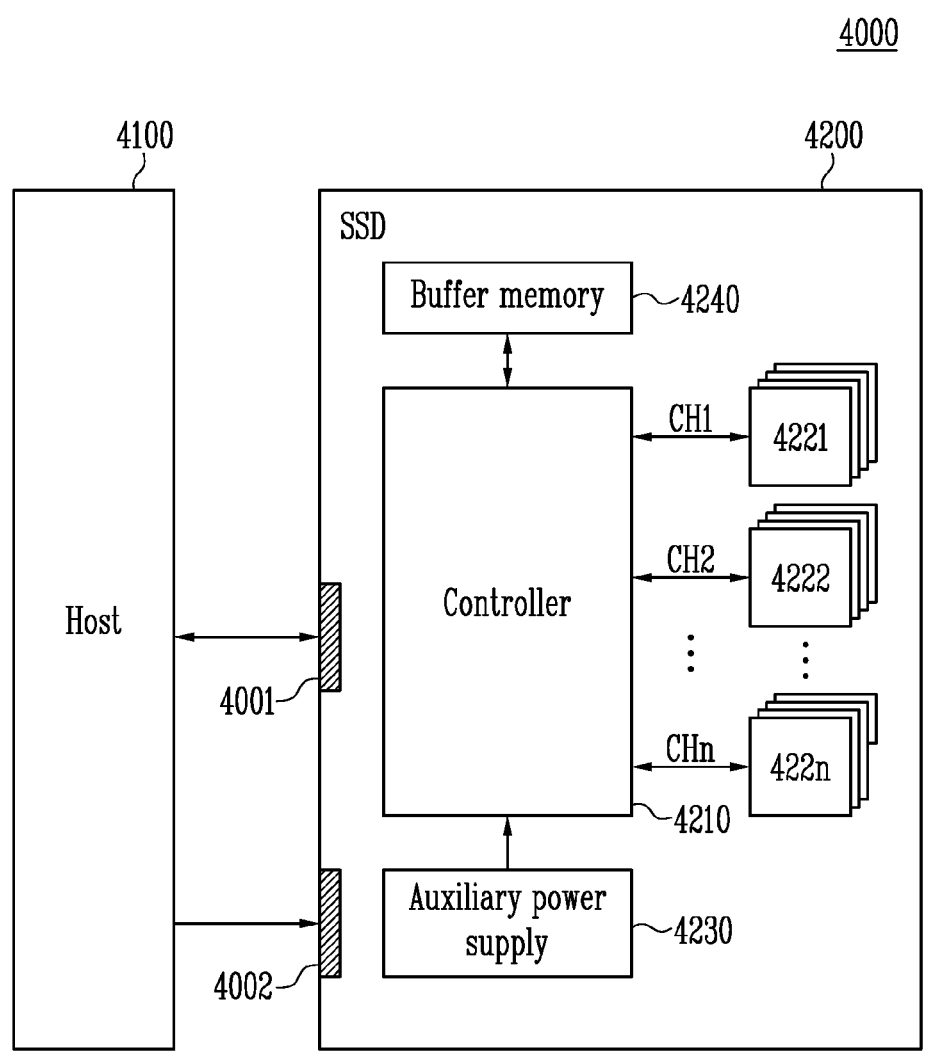
FIG. 13 is a diagram illustrating a Solid State Drive (SSD) system to which the memory device of the present disclosure is applied.

FIG. 13 is a diagram illustrating a Solid State Drive (SSD) system to which the memory device of the present disclosure is applied.

Referring to FIG. 13, the SSD system 4000 includes a host 4100 and an SSD 4200. The SSD 4200 exchanges a signal with the host 4100 through a signal connector 4001, and receives power through a power connector 4002. The SSD 4200 includes a controller 4210, a plurality of memory devices 4221 to 422n, an auxiliary power supply 4230, and a buffer memory 4240.

The controller 4210 may control the plurality of memory devices 4221 to 422n in response to a signal received from the host 4100. For example, the signal may be a signal based on an interface between the host 4100 and the SSD 4200. For example, the signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The plurality of memory devices 4221 to 422n may include a plurality of memory cells configured to store data. Each of the plurality of memory devices 4221 to 422n may be configured identically to the memory device 100 shown in FIG. 1. Therefore, each of the plurality of memory devices 4221 to 422n may perform a program operation by selectively applying the turn-on precharge mode and the GIDL precharge mode. The plurality of memory devices 4221 to 422n may communicate with the controller 4210 through channels CH1 to CHn.

The auxiliary power supply 4230 may be connected to the host 4100 through the power connector 4002. The auxiliary power supply 4230 may receive power PWR input from the host 4100 and charge the power PWR. When the supply of power from the host 4100 is not smooth, the auxiliary power supply 4230 may provide power of the SSD 4200. For example, the auxiliary power supply 4230 may be located in the SSD 4200, or be located at the outside of the SSD 4200.

For example, the auxiliary power supply 4230 may be located on a main board, and provide auxiliary power to the SSD 4200.

The buffer memory 4240 may operate as a buffer memory of the SSD 4200. For example, the buffer memory 4240 may store data received from the host 4100 or data received from the plurality of memory devices 4221 to 422*n*, or temporarily store meta data (e.g., a mapping table) of the memory devices 4221 to 422*n*. The buffer memory 4240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

In accordance with an embodiment, an operation time of a program operation performed in the memory device can be reduced, and the reliability of the program operation can be improved.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a memory block including first select transistors, memory cells, and second select transistors, which are connected between bit lines and a source line;
   a precharge controller configured to monitor a program operation of the memory cells, and change a precharge mode of unselected strings among strings included in the memory block according to a monitoring result; and
   a select line voltage generator configured to generate one of a positive voltage and a negative voltage, which is applied to a second select line connected to the second select transistors, according to the precharge mode selected in the precharge controller.

2. The memory device of claim 1, wherein the precharge controller is configured to:
   monitor target voltages of the memory cells in the program operation;
   compare a selected target voltage among the target voltages with a reference voltage; and
   change the precharge mode according to a comparison result.

3. The memory device of claim 2, wherein the reference voltage is set as a voltage higher than an intermediate voltage among the target voltages.

4. The memory device of claim 2, wherein, when the selected target voltage is equal to or lower than the reference voltage, the precharge controller controls the select line voltage generator such that the positive voltage is applied to the second select line.

5. The memory device of claim 2, wherein, when the selected target voltage is higher than the reference voltage, the precharge controller controls the select line voltage generator such that the negative voltage is applied to the second select line.

6. The memory device of claim 1, wherein the select line voltage generator is configured to generate the positive voltage to be applied to a first select line connected to the first select transistors as controlled by the precharge controller.

7. The memory device of claim 1, further comprising:
   a word line voltage generator configured to generate voltages to be applied to word lines connected to the memory cells; and
   a source line voltage generator configured to generate a voltage to be applied to the source line.

8. The memory device of claim 7, wherein the word line voltage generator is configured to:
   generate one of a program voltage and a verify voltage, which is to be applied to a selected word line among the word lines; and
   generate a pass voltage to be applied to unselected word lines among the word lines.

9. The memory device of claim 7, wherein the word line voltage generator is configured to generate a pass voltage to be applied to the word lines, when the unselected strings are precharged.

10. The memory device of claim 7, wherein the source line voltage generator is configured to generate a precharge voltage to be applied to the source line, when the unselected strings are precharged.

11. A memory device comprising:
    a memory block including selected strings and unselected strings, which are connected between bit lines and a source line;
    a source line voltage generator configured to apply a precharge voltage to the source line; and
    a select line voltage generator configured to apply one of a positive voltage and a negative voltage to a first select line adjacent to the bit lines and a second select line adjacent to the source line, wherein the first select line and the second select line are connected to the selected strings and the unselected strings,
    wherein the select line voltage generator is configured to:
    apply the positive voltage to the second select line to precharge the unselected strings when a target voltage of memory cells of selected memory cells included in the selected strings is equal to or lower than a reference voltage; and
    apply the negative voltage to the second select line to precharge the unselected strings when the target voltage is higher than the reference voltage.

12. The memory device of claim 11, further comprising a precharge controller configured to compare the target voltage with the reference voltage, and control the select line voltage generator according to a comparison result.

13. The memory device of claim 11, further comprising page buffers configured to apply a program allow voltage to bit lines connected to the selected strings among the bit lines, and apply a program inhibit voltage to bit lines connected to the unselected strings among the bit lines.

14. A method of operating a memory device, the method comprising:
- comparing, with a reference voltage, a target voltage of selected memory cells among memory cells included in selected strings and unselected strings;
- transmitting a precharge voltage supplied to a source line to the unselected strings by turning on select transistors included in the unselected strings when the target voltage is equal to or lower than the reference voltage, and transmitting the precharge voltage supplied to the source line to the unselected strings by using a leakage current of the select transistors when the target voltage is higher than the reference voltage; and
- programming the selected memory cells.

15. The method of claim 14, wherein the reference voltage is set as a voltage higher than an intermediate voltage among a plurality of target voltages of the selected memory cells.

16. The method of claim 14, wherein a positive voltage is applied a select line connected to the select transistors such that the select transistors are turned on.

17. The method of claim 14, wherein a negative voltage is applied to a select line connected to the select transistors such that the leakage current of the select transistors is used.

18. The method of claim 14, wherein the programming of the selected memory cells includes:
- applying a program voltage to a selected word line connected to the selected memory cells; and
- applying a pass voltage to unselected word lines connected to unselected memory cells except the selected memory cells.

19. The method of claim 14, further comprising verifying a threshold voltage of the selected memory cells after the programming of the selected memory cells.

* * * * *